United States Patent
Bloch et al.

[11] Patent Number: 6,098,655
[45] Date of Patent: Aug. 8, 2000

[54] ALLEVIATING STICKING OF NORMALLY CLOSED VALVES IN NUCLEAR REACTOR PLANTS

[75] Inventors: Richard J. Bloch, Raleigh; Ahmad A. Moccari, Cary, both of N.C.

[73] Assignee: Carolina Power & Light Company, Raleigh, N.C.

[21] Appl. No.: 08/760,167

[22] Filed: Dec. 3, 1996

[51] Int. Cl.[7] .............................. F16K 31/12; F16K 7/14
[52] U.S. Cl. .................. 137/488; 251/61.1; 251/368; 29/890.13
[58] Field of Search ................... 251/368, 61.1; 427/528, 531; 137/488; 29/890.13, 890.124, 890.126

[56] References Cited

U.S. PATENT DOCUMENTS

| | | |
|---|---|---|
| 3,583,672 | 6/1971 | Haller . |
| 3,832,219 | 8/1974 | Nelson et al. . |
| 3,928,159 | 12/1975 | Tadokoro et al. . |
| 4,054,426 | 10/1977 | White . |
| 4,464,422 | 8/1984 | Senda et al. . |
| 4,468,309 | 8/1984 | White . |
| 4,724,016 | 2/1988 | Anthony . |
| 4,764,394 | 8/1988 | Conrad . |
| 4,787,736 | 11/1988 | Mori et al. . |
| 4,800,100 | 1/1989 | Herbots et al. . |
| 4,872,922 | 10/1989 | Bunker et al. . |
| 4,915,746 | 4/1990 | Welsch . |
| 5,197,192 | 3/1993 | Wylie .................................. 251/61.1 |
| 5,199,999 | 4/1993 | Clapham et al. . |
| 5,275,377 | 1/1994 | Rubner . |
| 5,441,235 | 8/1995 | Narasimhan et al. . |
| 5,449,547 | 9/1995 | Miyazaki et al. . |

FOREIGN PATENT DOCUMENTS

| | | |
|---|---|---|
| 3148521 A1 | 6/1982 | Germany . |
| 62-167980 | 7/1987 | Japan . |

OTHER PUBLICATIONS

"Oxidation Behavior of a NiCrAl Alloy Recoil–Implanted with Yttrium", Westinghouse Research and Development Center. pp. 496–507.

"The Effects of Yttrium Ion Implantation Upon the Oxidation Behaviour of an Austenitic Stainless Steel", J.E. Antill et al. pp. 415–422.

"The Industrial Applications of Ion Beam Processes", Spire Corporation. pp. 373–388.

"Corrosion Protection of C0–Cr–Mo Alloy by Ion Implantation", Spire Corporation.

*Primary Examiner*—Denise L. Ferensic
*Assistant Examiner*—Joanne Y. Kim
*Attorney, Agent, or Firm*—Richard S. Faust

[57] ABSTRACT

Normally closed valves that operate in the environment of nuclear power plants are provided with surface-modified valve seat components to alleviate sticking of the valves. The surface modification is achieved by ion implantation of a coating of, for example, platinum, palladium, platinum/palladium or palladium/gold on at least one valve seat component.

14 Claims, 3 Drawing Sheets

Ion Beam Implantation Region

Seat Band Width

ALLEVIATING STICKING OF NORMALLY CLOSED VALVES IN NUCLEAR REACTOR PLANTS

FIELD OF THE INVENTION

The invention relates to the elimination of bonding of valve components. More particularly, the invention relates to the use of surface modification techniques to alleviate sticking of normally closed valves operating in the environment of a nuclear reactor plant.

BACKGROUND OF THE INVENTION

Both boiling water and pressurized water nuclear reactor plants employ various valves that must perform reliably in the operating reactor environment. In the case of a boiling water plant, a typical environment includes 540° F. water at 1000 psi with varying oxygen concentrations up to saturation conditions. In a pressurized water plant, on the primary side, water temperatures of approximately 600° F. at approximately 2200 psi are commonly found, with the secondary side being at approximately 540° F. and 1000 psi.

Among the valves that must operate in these environments are normally closed, pilot-operated safety/relief valves. The pilot stage assembly of such a valve includes a pilot valve that has mating seating surfaces that are continuously urged together under considerable force for extended periods of time. A serious problem facing the industry is that these mating seating surfaces tend to become bonded together over time in the reactor environment, resulting in valve malfunction particularly with respect to such valves not opening at their set points.

SUMMARY OF THE INVENTION

The present invention addresses the above described valve sticking problem by surface modification of at least one of the mating seating surfaces of the valve. Broadly stated, in one aspect the invention is the discovery that the sticking problem may be greatly reduced or eliminated by surface treatment of at least one of the mating seating surfaces by implanting either a noble material or another material with high oxidation resistance in this environment on the surface. Suitable noble implantation materials are platinum, palladium, palladium/gold, and platinum/palladium, with platinum and palladium being preferred, and platinum most preferred. Other implantation materials include diamond-like carbon and aluminum oxide. Ion beam techniques are used to implant the materials. The techniques include ion implantation, ion beam mixing and ion beam enhanced deposition, with ion beam enhanced deposition being preferred. The thickness of the ion beam implanted layer on the valve seat surface is preferably in the range of 0.5 micron to 10 microns, with a thickness in the range of 1 to 4 microns being preferred.

BRIEF DESCRIPTION OF THE DRAWINGS

Some of the objects having been stated, other objects will appear as the description proceeds, when taken in connection with the accompanying drawings, in which.

DETAILED DESCRIPTION OF THE INVENTION

While the present invention will be described more fully hereinafter with reference to the accompanying drawings, in which aspects of the preferred manner of practicing the present invention are shown, it is to be understood at the outset of the description which follows that persons of skill in the appropriate arts may modify the invention herein described while still achieving the favorable results of this invention. Accordingly, the description which follows is to be understood as being a broad, teaching disclosure directed to persons of skill in the appropriate arts, and not as limiting upon the present invention.

Description of a Representative Safety/Relief Valve Structure
(Prior Art)

Figure 1A:
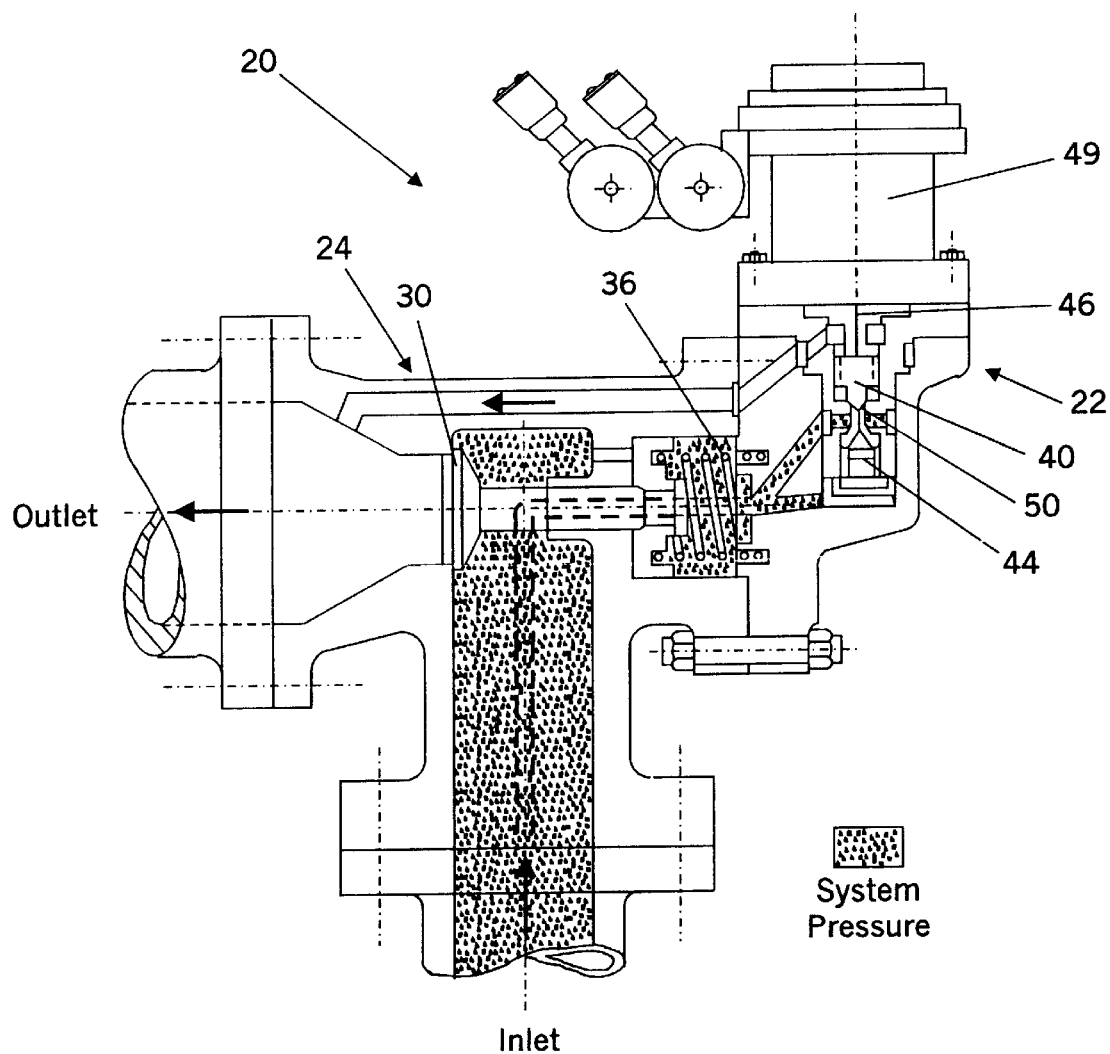
FIG. 1A is a schematic view of a pilot-operated safety/relief valve of the type utilized in boiling water nuclear reactor plants, with the valve being shown in its normally closed position.
Figure 1B:
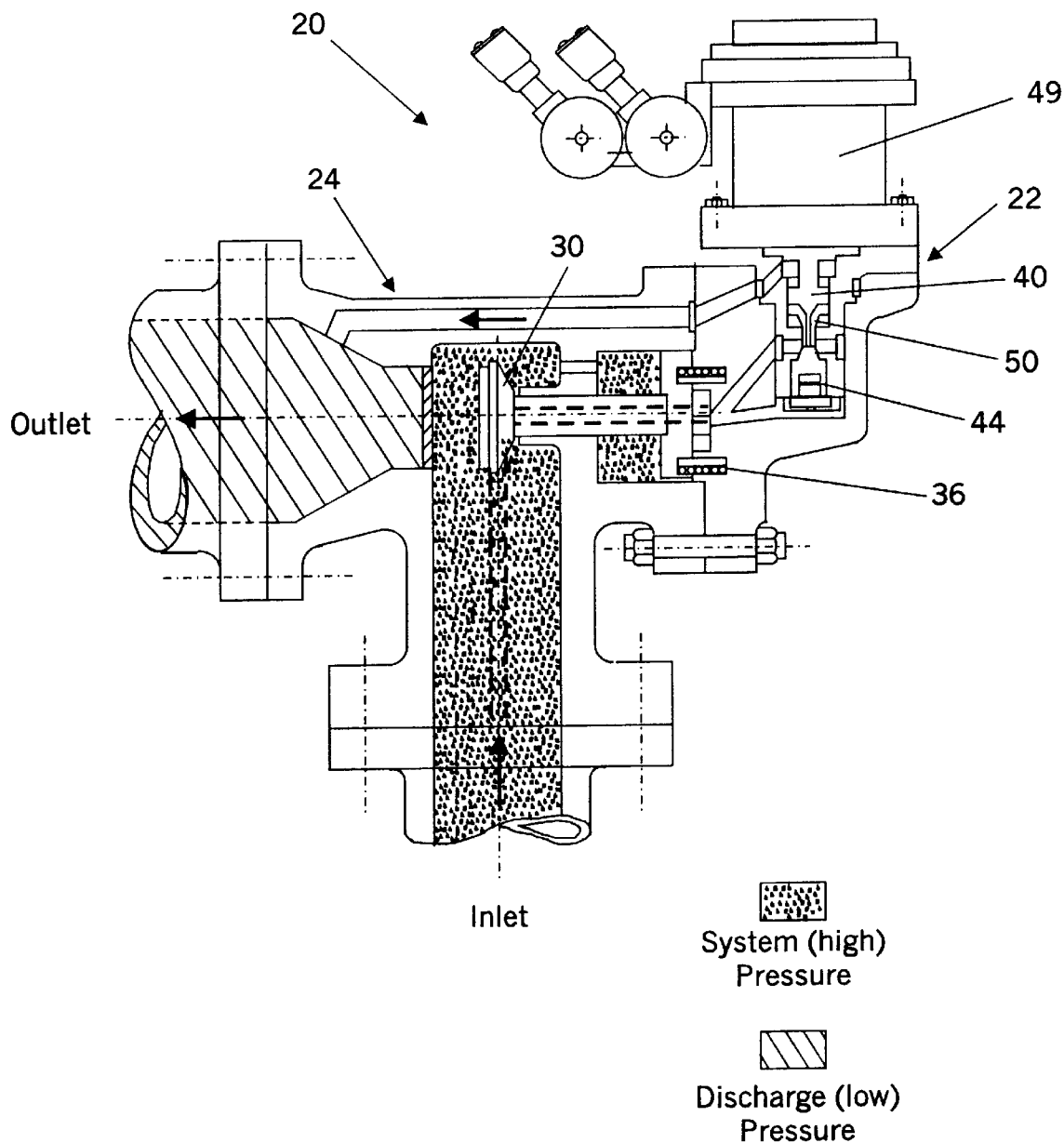
FIG. 1B is a view of the valve of FIG. 1A in the open position.

FIGS. 1A and 1B are schematic representations of a safety/relief valve commonly used in boiling water nuclear reactor plants to prevent the reactor vessel pressure from exceeding the vessel's design pressure, with FIG. 1A showing the valve in its normally closed position and FIG. 1B showing the valve in its open position. The illustrated valve 20 is in the general form of a pilot-operated safety/relief valve (Model No. 7567F) manufactured by Target Rock Corporation of Farmingdale, N.Y., USA. As is well known in the art, valve 20 includes a pilot stage assembly 22 and a main stage assembly 24. These two assemblies are directly coupled to provide a unitized common dual function safety/relief valve. The pilot stage assembly is the pressure sensing and control element, and the main stage assembly is a system fluid-actuated follower valve which provides the pressure relief function. Self-actuation of the pilot assembly at set pressure vents the main piston chamber, permitting the system pressure to fully open the main assembly, which results in system depressurization at full rated flow.

It will be appreciated that in the normally closed position (FIG. 1A), the main stage disc 30 is tightly seated by the combined forces exerted by the main preload spring 36 and the system internal pressure acting over the area of the disc. The safety/relief valve is designed so that when system pressure increases to the valve set pressure, the pilot stage structure will vent the chamber over the main stage piston to downstream of the valve via internal porting as shown in FIGS. 1A and FIG. 1B. This venting action creates a differential pressure across the main stage piston in a direction tending to unseat the valve.

The pilot assembly 22 of the valve 20 consists of two relatively small, low flow pressure-sensing elements. A spring-loaded pilot disc 40 senses the set pressure, and pressure-loaded stabilizer disc 44 senses the reseat pressure. Spring force (preload force) is applied to the pilot disc by means of a pilot rod 46. Thus, the adjustment of the spring preload force will determine the set pressure of the valve. During assembly, the pilot spring 49 is adjusted to provide a preload force on the pilot disc which will establish the required set pressure of the valve. The spring preload force seals the pilot disc tightly to prevent leakage at normal operating pressures or lower system pressures.

In operation, as system pressure increases and reaches set pressure, the seating force acting on the pilot disc is reduced to zero causing the pilot disc to lift from its seat 50. Pilot disc lift results in the depressurization of the main piston chamber volume. Initial venting (depressurization) of the main piston chamber creates a differential pressure across the stabilizer disc in a direction causing the stabilizer disc to seat. System pressure acting upon the stabilizer disc via the internal porting maintains the pilot disc in the "lifted" position thereby maintaining main piston chamber venting until the required differential pressure across the main piston is achieved, at which point the main stage opens. When system pressure has decreased to the valve reseat pressure, the pressure-sensing stabilizer disc will unseat permitting the pilot disc to reseat; this in turn causes main piston chamber repressurization, which results in closing of the main stage.

The problem facing the industry is that when pilot disc 40 should be lifting from seat 50 at set point pressure, a bonding that has taken place between the mating seating surfaces of disc 40 and seat 50 causes pilot valve sticking such that the valve will not open at the designated set point or will not open at all. One theory is that there is oxide-induced bonding between the mating seating surfaces of pilot disc 40 and seat 50. The discs and seats are typically formed of a metallic alloy such as Stellite, a cobalt-chromium alloy.

Figure 2:
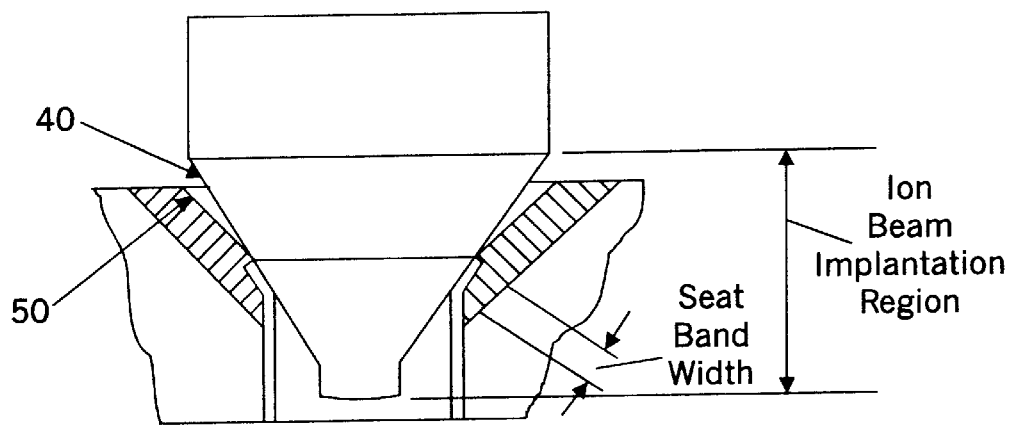
FIG. 2 is an enlarged view of the pilot valve seating elements of the safety/relief valve of FIGS. 1A and 1B showing the seating area on the pilot disc that is surface-modified in accordance with the invention.

FIG. 2 is an enlarged view of pilot disc 40 and seat 50 in the "disc-down" or closed position. The mating seating surfaces of disc 40 and seat 50 extend over the illustrated seat band width, for example, a width of 1/32 inch.

Surface Modification of the Valve Seat Components

EXAMPLE I

A test program was conducted to demonstrate the effect of surface modification on five metallic alloys that represent likely candidates for use as seating valve components in the normally closed valves in boiling water nuclear power plants. Test samples formed from these five alloys were implanted with six implantation materials and thereafter exposed to a simulated boiling water nuclear power plant environment. Next, tests were performed on the test samples to determine the efficacy of the implantation in alleviating sticking.

The five substrate materials used in the test program included Stellite 6B, the valve material most commonly used for safety/relief valves in boiling water nuclear power plants. The others were: PH 13-8 Mo stainless steel, Carpenter 20-Cb3 steel, Inconel 690, and Stellite 21. The PH 13-8 Mo is similar in hardness to Stellite 6B and in other characteristics to 17-4 PH stainless steel which has been used extensively in BWR valve applications. Both of these alloys are iron-based and do not intentionally contain cobalt. Stellite 21 is a cobalt-based alloy and contains molybdenum. Inconel 690, a nickel-based alloy, has a high chromium content and has exhibited good performance in the PWR steam generator environment.

The nominal chemical compositions of the substrate materials are presented in Table 1.

in diameter. All of the test samples were polished with 240, 320, and 600 grit silicon carbide (SiC) papers, lapped with 6 $\mu$m and then 1 $\mu$m diamond paste, and ultrasonically cleaned in acetone and distilled water prior to each test. This sample configuration was selected because of its adaptability to surface modification, as well as its adaptability to sticking tests and electrochemical corrosion testing, discussed below.

The test system employed for both the sticking and the electrochemical testing consisted of a 1 liter autoclave with a heat exchanger fed by a high pressure pump, which provided a flow rate of 2 liters/hour. The autoclave was fabricated from Hastelloy C276 with a well-oxidized surface. All other heated portions of the system were well-oxidized Type 316L stainless steel. The make-up and recirculating water were deionized water fed from a 50 liter Type 316 stainless steel tank which was purged with air to establish an oxygen-saturated condition. Inlet water to the autoclave was monitored for pH and dissolved oxygen concentration. All of the sticking and electrochemical tests were performed under the following conditions similar to those of a boiling water reactor operating environment:

Temperature: 540±10° F.

Pressure: 1050±50 psi

Oxygen concentration: 8 parts per million(ppm)

PH: 6.5±0.5

The duration for each of the sticking tests was about 4 to 5 weeks.

The test samples were implanted using three surface modification techniques: (a) ion implantation, (b) ion beam mixing, and (c) ion beam enhanced deposition.

(a) Ion Implantation This process consists of bombarding the surface of the material in a vacuum using an electrically accelerated beam of ions. These particles become embedded to a depth which is controlled by the incident ion energy which is usually in the range of 50 to 500 KeV.

(b) Ion Beam Mixing Ion beam mixing introduces atoms into the host material through the bombardment of a pre-deposited coating (100 to 1000 Å thick) by high energy ions (10 to 200 KeV).

(c) Ion Beam Enhanced Deposition Ion beam enhanced deposition (IBED) involves simultaneous thin film deposition (an atomic layer in thickness) and ion bombardment (100 to 1000 eV ion beam). The IBED technique allows a better interdiffusion and a thicker alloyed coating to be obtained than by pure ion implantation or by ion beam mixing, and is the preferred technique. A schematic representation of an IBED system of the type used to implant coatings in certain of the substrates in Example I, and the discs of

TABLE 1

| | Element (Weight %) | | | | | | | | | | | | |
|---|---|---|---|---|---|---|---|---|---|---|---|---|---|
| MATERIAL | Ni | Cr | Mo | Si | Al | Mn | C(max) | P(max) | Co | W | Cu | S | Fe |
| PH 13-8 Mo | 8.09 | 12. | 2.1 | .05 | 1.1 | .1 | 0.05 | 0.01 | — | — | — | 0.008 | Bal |
| Stellite 6B | 1 | 30 | — | — | — | — | 1 | — | 61.5 | 4.5 | — | — | 1 |
| Carpenter 20-Cb3 | 32.5–35 | 19–21 | 2–3 | 1 max | — | 2 max | 0.06 | 0.035 | — | — | 3–4 | 0.035 max | Bal |
| Inconel 690 | 58.0 min | 28–31 | — | 0.50 max | — | 0.50 max | 0.04 | — | 0.10 max | — | 0.50 max | 0.015 max | 7–11 |
| Stellite 21 | 1 | 27 | 5 | 1 | — | 1 | 0.35 | — | Bal | — | — | — | 7–11 |

The six implantation materials used for surface modification were platinum, boron plus nitrogen, boron nitride, diamond-like carbon, palladium, and aluminum oxide.

Figure 3:
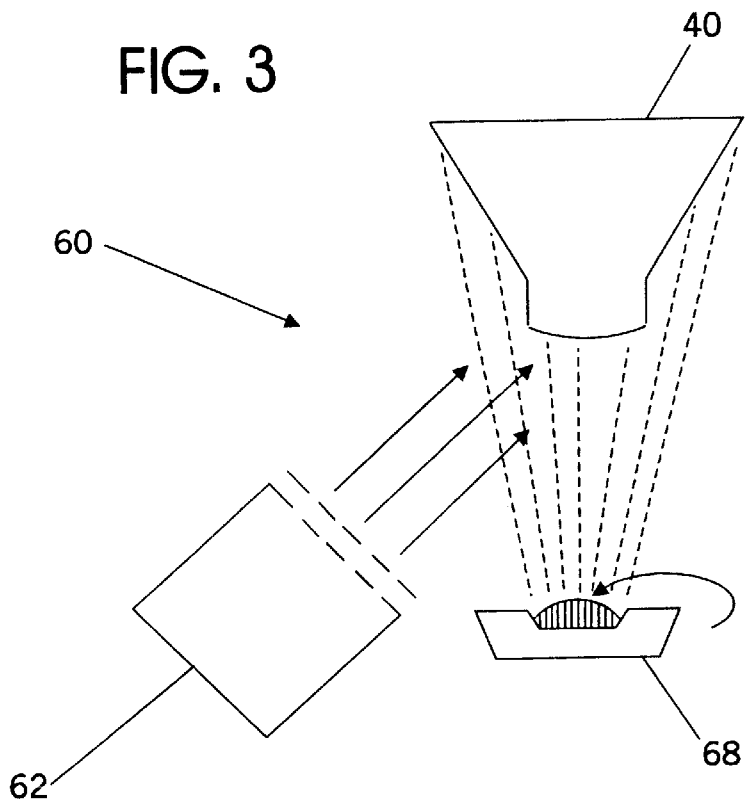
FIG. 3 is a schematic representation of an ion beam enhanced deposition system of the type utilized in the surface modification of a pilot disc according to the invention.

Test samples were machined from the six substrate materials in the form of cylinders, 0.5-inch in length and 3/8-inch Examples II and III, is shown in FIG. 3. IBED system 60 includes an ion source 62 that provides an accelerated beam of ions directed to the substrate (or disc) 40. The ions preferably are inert gas ions such as argon. The deposited species (e.g., platinum) is delivered by physical vapor deposition, for example by evaporation from an electron beam evaporation hearth 68 or, alternatively, by delivery from a sputter ion source.

The process parameters for obtaining coatings on metallic alloy substrates of the materials specified herein, and at the thickness specified herein, are known or can be empirically derived by those skilled in the art of implantation. For example, the ion species may be produced by a relatively low energy from about 200 to 2000 eV to produce an ion current density on the order of 10 to 100 $\mu A/cm^2$. It will be appreciated that the process referred to herein as ion beam enhanced deposition is also variously referred to as ion assisted coating (IAC), ion assisted deposition (IAD), ion vapor deposition (IVD), dynamic recoil mixing (IRM) and ion beam assisted deposition (IBAD).

The advantage offered by these ion beam techniques is that the mixing of the implanted material(s) into the substrate material is not controlled by the equilibrium solubility limits of the mixed materials. Also, since the depth of the implanted material is a few microns or less, then the surface oxidation resistance will be modified without affecting the mechanical properties of the bulk alloy.

The sticking evaluation test was an immersion test in which, for example, a sample of bare Stellite 6B material was bolted against another sample of bare Stellite 6B and exposed to the test environment. Likewise, samples of the other substrate materials were bolted against each other, samples of bare Stellite 6B were bolted against each of the other substrate materials, and samples of bare Stellite 6B were bolted against each of the implanted materials. The bolting torque was such as to produce a force equivalent to that calculated to be exerted on the seating area of a safety/relief valve disc. The objective of this testing was to simulate sticking in the laboratory with the cylindrical sample configuration and to determine which of the alloy combinations would stick and with what degree of severity. The results of this sticking test for as-received bare substrate materials showed the following samples to be stuck:

Inconel 690 to Inconel 690

Carpenter 20-Cb3 to Carpenter 20-Cb3

PH 13-8 Mo to PH 13-8 Mo

Stellite 6B to Stellite 6B

The Stellite 6B in the as-received bare condition stuck to itself and to the other bare substrate materials. The contact surfaces of all of the as-received bare samples upon disassembly were observed to be tarnished, and appeared to be covered with a visible oxide as was observed in the first test.

Sticking tests of the platinum-implanted materials (both contacting surfaces were implanted) were performed. The results of this test showed that the platinum-implanted samples (both couples implanted) of Stellite 6B to Stellite 6B, PH 13-8 Mo to PH 13-8 Mo, Carpenter 20-Cb3 to Carpenter 20-Cb3, and Inconel 690 to Inconel 690, Stellite 6B to PH 13-8 Mo, and Stellite 6B to Carpenter 20-Cb3 did not stick. It was also observed that the contact surfaces of the implanted materials upon disassembly after testing were generally shiny with very slight discoloration.

Next, as-received bare samples were tested for sticking against implanted samples. Sticking tests of Stellite 6B samples in the bare condition against one of each implanted (boron-nitride, boron+nitrogen, and diamond-like carbon) substrate materials (Carpenter 20-Cb3, PH 13-8 Mo, Inconel 690, Stellite 6B, and Stellite 21), and implanted PH 13-8 Mo against bare PH 13-8 Mo, implanted Carpenter 20-Cb3 against bare Carpenter 20-Cb3, implanted Inconel 690 against bare Inconel 690, Stellite 6B in the bare condition against bare Stellite 6B, bare Stellite 6B against bare Stellite 21, and bare Stellite 21 against bare Stellite 21 were performed.

The test results showed that boron-nitride implanted PH 13-8 Mo stainless steel sample against the bare PH 13-8 Mo sample exhibited sticking. Bare Stellite 6B was stuck to bare Stellite 6B. The contact surfaces of the bare Stellite 6B, Stellite 21, and the other bare substrates upon disassembly after testing were observed to be slightly discolored. The discoloration appeared to be more pronounced for bare Stellite 6B against the implanted PH 13-8 Mo, bare Carpenter 20-Cb3 against the implanted Carpenter 20-Cb3, bare Stellite 6B against bare Stellite 21, and bare Stellite 21 against bare Stellite 21.

Sticking tests of platinum and palladium implanted samples (test samples were implanted using ion beam mixing) were performed under the same conditions mentioned above. No sticking was observed in this test.

The sticking test results are summarized in Table 2.

TABLE 2

1 - Platinum implanted samples

All of the bare Stellite 6B samples were discolored black.
All of the implanted samples were slightly tarnished on one side along the OD surface
The contact surfaces of the Stellite 6B samples and the implanted materials were tarnished around the outside edges.
The coating on the Stellite 21 samples was slightly peeled off.

2 - Boron + Nitrogen implanted samples

All of the bare Stellite 6B samples were discolored black.
The bare Stellite 6B sample was stuck to the implanted PH 13-8 Mo sample.
All of the implanted samples were tarnished.

3 - Diamond-like carbon implanted sample

All of the bare Stellite 6B samples were tarnished.
No sticking was observed.

4 - Boron nitride implanted samples

All of the bare Stellite 6B samples were tarnished.
The bare PH 13-8 Mo sample was stuck to the implanted PH 13-8 Mo sample.

5 - Palladium implanted samples

All of the bare Stellite 6B samples were discolored black.
All of the implanted samples were slightly tarnished on one side along the OD surfaces.
The contact surfaces of the Stellite 6B sample and the implanted materials were tarnished around the outside edges.

Electrochemical tests were conducted using a potentiostat-galvanostat (Model 273, EG&G Princeton Applied Research). For each test, after the system temperature and pressure were reached, the corrosion potential was monitored and allowed to stabilize for about 24 hours, and then potentiodynamic polarization tests were performed. All potentials were measured against a high temperature high pressure Ag/AgCl internal reference electrode.

Electrochemical corrosion testing of bare and implanted Stellite 6B (with platinum, palladium, and boron+nitrogen) was performed. The platinum and the palladium implanted Stellite 6B exhibited lower current densities than either the bare or the boron +nitrogen implanted Stellite 6B. The current densities were very low, $\leq 500$ micro amperes per square centimeter ($\mu A/Cm^2$).

Steam scouring tests were performed for the purpose of subjecting selected samples to impinging steam to determine their resistance to the "cutting" effects of the steam. The implanted depths were measured nondestructively at one location at the center of the base of each sample using Rutherford Backscattering Spectrometry (RBS) prior to and after the steam scouring test. RBS analysis was performed by bombarding the sample target with a monoenergetic beam of high energy helium or hydrogen particles with an energy of 1 to 2 MeV. A summary of the steam scouring test results is presented in Table 3. The RBS results are presented in Table 4.

TABLE 3

| Substrate Material | Implantation Materials | Pre-test Observation | Post Test Condition |
| --- | --- | --- | --- |
| Inconel 690 | Diamond-like Carbon (DLC) | Satisfactory | Discoloration on the sides |
| Inconel 690 | Palladium (Pd) | Satisfactory | Condensate spots |
| Inconel 690 | Platinum (Pt) | Satisfactory | No observable anomalies |
| Inconel 690 | Aluminum Oxide ($Al_2O_3$) | Satisfactory | No observable anomalies |
| Inconel 690 | Boron nitride (BN) | Satisfactory | No observable anomalies |
| Inconel 690 | Boron + Nitrogen (B/N) | Satisfactory | No observable anomalies |
| Stellite 6B | DLC | Satisfactory | Discoloration on sides |
| Stellite 6B | Pd | Satisfactory | No observable anomalies |
| Stellite 6B | Pt | Satisfactory | No observable anomalies |
| Stellite 6B | Pt | Satisfactory | No observable anomalies |
| Stellite 6B | $Al_2O_3$ | Satisfactory | Condensate spots |
| Stellite 6B | BN | Satisfactory | No observable anomalies |
| Stellite 6B | B/N | Satisfactory | Condensate spots/Discolor. |
| PH 13-8Mo | DLC | ** | No observable anomalies |
| PH 13-8Mo | Pd | Satisfactory | Was not in sample holder |
| PH 13-8Mo | Pt | Satisfactory | Coating was peeling off |
| PH 13-8Mo | $Al_2O_3$ | Satisfactory | Discoloration on the edges |
| PH 13-8Mo | BN | Satisfactory | Evidence of peeling |
| PH 13-8Mo | B/N | Satisfactory | No observable anomalies |
| Carpenter 20-Cb3 | DLC | Satisfactory | Surface discoloration |
| Carpenter 20-Cb3 | Pd | Satisfactory | No observable anomalies |
| Caeeenter 20-Cb3 | Pt | Satisfactory | No observable anomalies |
| Carpenter 20-Cb3 | $Al_2O_3$ | Satisfactory | Surface finish indication |
| Carpenter 20-Cb3 | BN | Satisfactory | Condensate spots |
| Carpenter 20-Cb3 | B/N | Satisfactory | Surface discoloration |
| Stellite 21 | DLC | *** | *** |
| Stellite 21 | Pd | Satisfactory | No observable anomalies |
| Stellite 21 | Pt | Satisfactory | No observable anomalies |

**Foreign material on sides of sample which was found to be adhesive from tape.
***Layer was flaking off, therefore the sample was not tested.

TABLE 4

| Substrate Material | Implantation Materials | Pre-test Thickness | Post Test Condition |
| --- | --- | --- | --- |
| Inconel 690 | Diamond-like Carbon (DLC) | 1.4 | No carbon peak was detected |
| Inconel 690 | Palladium (Pd) | 3.3 | No change |
| Inconel 690 | Platinum (Pt) | 1.25 | No change |
| Inconel 690 | Aluminum Oxide ($Al_2O_3$) | 3.4 | Slightly dissolved |
| Inconel 690 | Boron nitride (BN) | 2.1 | BN was dissolved |
| Inconel 690 | Boron + Nitrogen (B/N) | 0.5 | No nitrogen peak was detected |
| Stellite 6B | DLC | 1.4 | No change |
| Stellite 6B | Pd | 3.45 | No change |
| Stellite 6B | Pt | 1.2 | No change |
| Stellite 6B | Pt | 3.1 | No platinum peak was detected |
| Stellite 6B | $Al_2O_3$ | 3.44 | Slightly changed |
| Stellite 6B | BN | 2.1 | BN was dissolved |
| Stellite 6B | B/N | 1.6 | No nitrogen peak was detected |
| PH 13-8Mo | DLC | 1.4 | Sample was missing |
| PH 13-8Mo | Pd | 4.85 | Coating was flaking off |
| PH 13-8Mo | Pt | 2.7 | Coating was flaking off |
| PH 13-8Mo | $Al_2O_3$ | 3.4 | No change |
| PH 13-8Mo | BN | 2.1 | BN was dissolved |
| PH 13-8Mo | B/N | 0.5 | No nitrogen peak was detected |
| Carpenter 20-Cb3 | DLC | 1.4 | Carbon was partially dissolved |
| Carpenter 20-Cb3 | Pd | 3.0 | No change |
| Carpenter 20-Cb3 | Pt | 1.3 | No change |
| Carpenter 20-Cb3 | $Al_2O_3$ | 3.44 | No change |
| Carpenter 20-Cb3 | BN | 2.1 | BN was dissolved |
| Carpenter 20-Cb3 | B/N | 0.5 | No nitrogen peak was detected |
| Stellite 21 | DLC | 1.4 | No carbon peak was detected |
| Stellite 21 | Pd | 4.6 | No change |
| Stellite 21 | Pt | 2.85 | No change |

The results of the above test program indicated that ion beam implantation would predictably alleviate the sticking problem in the pilot stage of the safety/relief valves provided that the implanted material is stable and that it is properly implanted.

Platinum implanted by ion beam enhanced deposition showed the most promise along with palladium implantation. The results also indicate that platinum/palladium mixtures and platinum or palladium mixed with other noble metals would predictably alleviate the valve sticking problem, as well as the use of diamond-like carbon, aluminum oxide and other materials with high oxidation resistance in this environment.

EXAMPLE II

Three Target Rock Corporation pilot-operated safety/relief valves (Model No. 7567F) with surface-modified Stellite 6B pilot discs were installed on an experimental basis in a boiling water nuclear reactor plant environment for approximately ten months along with eight valves with untreated pilot discs. The three surface-modified discs were treated according to the procedure outlined in Example I with IBED implanted platinum layers on the three discs with thicknesses of 1.25 microns, 1.05 microns and 1.10 microns, respectively. The surface modification was limited to the conical part of the discs 40 (FIG. 2) which includes the seating area with the mating portion of seat 50 being untreated. Following the ten month partial fuel cycle, the thickness of each ion beam implanted platinum layer was similar to its thickness prior to in service exposure. Based upon a close visual examination, scanning electron microscope examination, and scanning electron microscope/energy dispersive spectrometry analysis, all three surface-modified discs were found to be in excellent condition, virtually unaffected by the ten-month service. The surface-modified discs were observed to alleviate the sticking problem.

EXAMPLE III

Three Target Rock Corporation pilot-operated safety/relief valves (Model No. 7567F) with surface-modified Stellite 6B pilot discs were installed in a boiling water nuclear reactor plant environment for approximately eighteen months along with eight valves with untreated pilot discs. The three surface-modified discs were treated according to the procedure outlined in Example I with IBED implanted platinum layers on the three discs with thicknesses of 1.18 microns, 1.18 microns and 1.05 microns, respectively. The surface modification was limited to the conical part of the discs 40 (FIG. 2) which includes the seating area, with the mating portion of seat 50 being untreated. Following the eighteen month full fuel cycle, the thickness of each ion beam implanted platinum layer was similar to its thickness prior to in service exposure. Based upon a close visual examination, scanning electron microscope examination, and scanning electron microscope/energy dispersive spectrometry analysis, all three discs were found to be in excellent condition, virtually unaffected by the eighteen-month service. The surface-modified pilot discs were observed to alleviate the sticking problem.

While the invention has been described in connection with certain illustrated embodiments, it will be appreciated that modifications may be made without departing from the true spirit and scope of the invention.

That which is claimed is:

1. In a nuclear reactor plant having a reactor vessel, safety/relief valve connected in fluid communication with the reactor vessel to prevent the reactor vessel pressure from exceeding a set point that is defined with respect to the vessel's design pressure, said safety/relief valve including a pilot stage for sensing vessel pressure and a main stage for relieving fluid pressure from the reactor vessel when the pilot stage senses a vessel pressure above the point, and said pilot stage including a rigid pilot disc and a rigid seat that together define respective mating seating surfaces, means urging the pilot disc and seat together under preload force for extended periods of time, and at least one of said mating seating surfaces having an ion implanted, metallurgically bonded coating of a material having sufficient oxidation resistance in a nuclear reactor plant environment to provent undesirable set point drift caused by sticking together of the pilot disc to the seat at their mating seating surfaces.

2. The valve of claim 1 wherein said ion implanted coating comprises noble material.

3. The valve of claim 2 wherein said coating has a thickness on the order of 0.5 micron to 10 microns.

4. The valve of claim 3 wherein the noble material is selected from the group consisting of: platinum, palladium, platinum/palladium mixture, platinum mixed with other noble metals and palladium mixed with other noble metals.

5. The valve of claim 2 wherein said coating has a thickness on the order of 1 to 4 microns.

6. The valve of claim 5 wherein the noble material is selected from the group consisting of: platinum, palladium, platinum/palladium mixture, platinum mixed with other noble metals and palladium mixed other noble metals.

7. The valve of claim 1 wherein the seating surface is formed on a cobalt-chromium alloy.

8. In a boiling water or pressurized water nuclear reactor plant, a normally closed valve operatively connected with exposure to the internal conditions of the plant, said valve having mating, rigid male/female valve components that together define respective mating seating surfaces, means urging the valve components together under force for extended periods of time, and at least one of said mating seating surfaces having an ion implanted, metallurgically bonded coating of a material having sufficient oxidation resistance in a nuclear reactor plant environment to prevent undesirable sticking together of the valve components at their mating scating surfaces.

9. The valve of claim 8 wherein said ion implanted coating comprises noble material.

10. The valve of claim 9 wherein said coating has a thickness on the order of 0.5 micron to 10 microns.

11. The valve of claim 10 wherein the noble material is selected from the group consisting of: platinum, palladium, platinum/palladium mixture, platinum mixed with other noble metals and palladium mixed with other noble metals.

12. The valve of claim 9 wherein said coating has a thickness on the order of 1 to 4 microns.

13. The valve of claim 12 wherein the noble material is selected from the group consisting of: platinum, palladium, platinum/palladium mixture, platinum mixed with other noble metals and palladium mixed with other noble metals.

14. The valve of claim 8 wherein the seating surface is formed on a cobalt-chromium alloy.

* * * * *